(12) United States Patent
Hayashi

(10) Patent No.: US 6,531,356 B1
(45) Date of Patent: Mar. 11, 2003

(54) SEMICONDUCTOR DEVICES AND METHODS OF MANUFACTURING THE SAME

(75) Inventor: Masahiro Hayashi, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/491,923

(22) Filed: Jan. 27, 2000

(30) Foreign Application Priority Data

Jan. 27, 1999 (JP) .......................................... 11-018665
Dec. 7, 1999 (JP) .......................................... 11-348034

(51) Int. Cl.⁷ ......................................... H01L 21/8238
(52) U.S. Cl. ....................... 438/228; 438/297; 438/298; 438/301; 438/306; 438/225; 438/224; 438/227; 438/294; 257/327; 257/336; 257/337; 257/338; 257/339
(58) Field of Search ................................. 438/294, 297, 438/298, 301, 306, 288, 225, 224, 227, 228; 257/327, 336–339, 404

(56) References Cited

U.S. PATENT DOCUMENTS 5,290,714 A * 3/1994 Onozawa .................... 438/207

FOREIGN PATENT DOCUMENTS

| JP | 1-268171 | 10/1989 | ............ H01L/29/78 |
| JP | 7-078881 | 3/1995 | ....... H01L/27/8234 |
| JP | 8-274268 | 10/1996 | ............ H01L/27/08 |

* cited by examiner

*Primary Examiner*—Wael Fahmy
*Assistant Examiner*—Hsien-Ming Lee
(74) *Attorney, Agent, or Firm*—Konrad Raynes Victor & Mann, LLP; Alan S. Raynes

(57) ABSTRACT

Embodiments include a semiconductor device including a well structure such that well areas can be formed with a higher density of integration and a plurality of high-voltage endurable transistors can be driven independently of one another with different voltages, and a method of manufacturing the semiconductor device. The semiconductor device may include a triple well comprising a first well formed in a silicon substrate and having a first conductivity type (P-type), a second well formed in adjacent relation to the first well and having a second conductivity type (N-type), and a third well formed in the second well and having the first conductivity type (P-type). A high-voltage endurable MOSFET is provided in each of the wells. Each MOSFET has an offset area in the corresponding well around a gate insulating layer. The offset area is formed of a low-density impurity layer which is provided under an offset LOCOS layer on the silicon substrate.

19 Claims, 10 Drawing Sheets

SEMICONDUCTOR DEVICES AND METHODS OF MANUFACTURING THE SAME

TECHNICAL FIELD

The present invention relates to semiconductor devices, and methods for their manufacture, including field effect transistors having a high breakdown voltage, and methods of manufacturing such semiconductor devices.

BACKGROUND

With recent downsizing and higher integration of semiconductor integrated circuits, there are demands for not only further downsizing of transistors, but also a higher density of integration in terms of well areas. Those demands also arise in a semiconductor device including a high-voltage endurable transistor to which a voltage not lower than 10 V, for example, is applied.

SUMMARY

One embodiment of the present invention relates to a semiconductor device including a first well formed in a semiconductor substrate and having a first conductivity type, a second well formed in the semiconductor substrate adjacent to the first well and having a second conductivity type, and a third well formed in the second well and having the first conductivity type. The device also includes a field effect transistor formed in each of said wells, the field effect transistor having an offset area in the semiconductor substrate around a gate insulating layer. The offset area is formed of a low-density impurity layer which is provided under a LOCOS layer on the semiconductor substrate.

Another embodiment relates to a method of manufacturing a semiconductor device, including selectively forming, on a semiconductor substrate, an oxidation-resistant layer having a masking action against oxidation. An impurity of second conductivity type is introduced to the semiconductor substrate with the oxidation-resistant layer used as a mask, thereby forming a second well in the semiconductor substrate. A surface area of said second well is selectively oxidated with the oxidation-resistant layer used as a mask, thereby forming a LOCOS layer in the second well. The oxidation-resistant layer is removed and an impurity of the first conductivity type is introduced to the semiconductor substrate with the LOCOS layer used as a mask, thereby forming a first well in the semiconductor substrate in adjacent relation to the second well. The LOCOS layer is removed, and an impurity of the first conductivity type is introduced to part of the second well, thereby forming a third well in the second well. A field effect transistor is formed in each of said first, second and third wells, by a process including: (1) after introducing an N-type and P-type impurity in predetermined areas of the semiconductor substrate, forming a LOCOS layer in a predetermined pattern on the semiconductor substrate to form N-type and P-type low-density impurity layers in the predetermined areas under the LOCOS layer, part of the LOCOS layer being formed at least around a gate insulating layer of the field effect transistor; (2) forming a gate electrode; and (3) forming a high-density impurity layer comprising a source/drain area.

Another embodiment relates to a semiconductor device including a silicon substrate having a first conductivity type. The device includes a first well of the first conductivity type in the substrate, a second well of a second conductivity type adjacent to the first well in the substrate, and a third well of the first conductivity type formed within a portion of the second well, wherein the third well is electrically isolated by the second well. The device also includes a first field effect transistor formed in the first well. The first field effect transistor includes a first gate insulating layer provided in the first well, a first gate electrode on the first gate insulating layer, a first offset LOCOS layer outside of the first gate insulating layer, a first offset impurity layer comprising a low density impurity layer of the second conductivity type formed under the first offset LOCOS layer, and a first high density impurity layer of the second conductivity type provided outside the first offset LOCOS layer to serve as source/drain areas. The device also includes a second field effect transistor formed in the second well. The second field effect transistor includes a second gate insulating layer provided in the second well, a second gate electrode on the second gate insulating layer, a second offset LOCOS layer outside of the second gate insulating layer, a second offset impurity layer comprising a low density impurity layer of the first conductivity type formed under the second offset LOCOS layer, and a second high-density impurity layer of the first conductivity type provided outside the second offset LOCOS layer to serve as source/drain areas. The device also includes a third field effect transistor formed in the third well. The third field effect transistor includes a third gate insulating layer provided in the third well, a third gate electrode on the third gate insulating layer, a third offset LOCOS layer outside of the third gate insulating layer, a third offset impurity layer comprising a low density impurity layer of the second conductivity type formed under the third offset LOCOS layer, and a third high density impurity layer of the second conductivity type provided outside the third offset LOCOS layer to serve as source/drain areas. The device also includes a first LOCOS isolation layer electrically separating the first and second field effect transistors and a second LOCOS isolation layer electrically separating the second and third field effect transistors.

Still another embodiment relates to a method of manufacturing a semiconductor device, including forming a first well of a first conductivity type in a semiconductor substrate, forming a second well of a second conductivity type in the semiconductor substrate, and forming a third well within the second well, the third well having the first conductivity type. The third well is formed to be approximately ⅓ to approximately ½ the depth of the second well. A field effect transistor is formed in each of the first, second and third wells by introducing a low density impurity selected from the group consisting of an N-type impurity and a P-type impurity into predetermined areas of the semiconductor substrate, forming a LOCOS layer in a predetermined pattern on the semiconductor substrate, forming a gate electrode, and forming a high density impurity layer comprising a source/drain area. At least a portion of the LOCOS layer is positioned adjacent to and in contact with a gate insulating layer and the gate electrode.

BRIEF DESCRIPTION OF THE INVENTION

Certain embodiments of the invention are described with reference to the accompanying drawings which, for illustrative purposes, are schematic and not necessarily drawn to scale.

DETAILED DESCRIPTION

Figure 1:
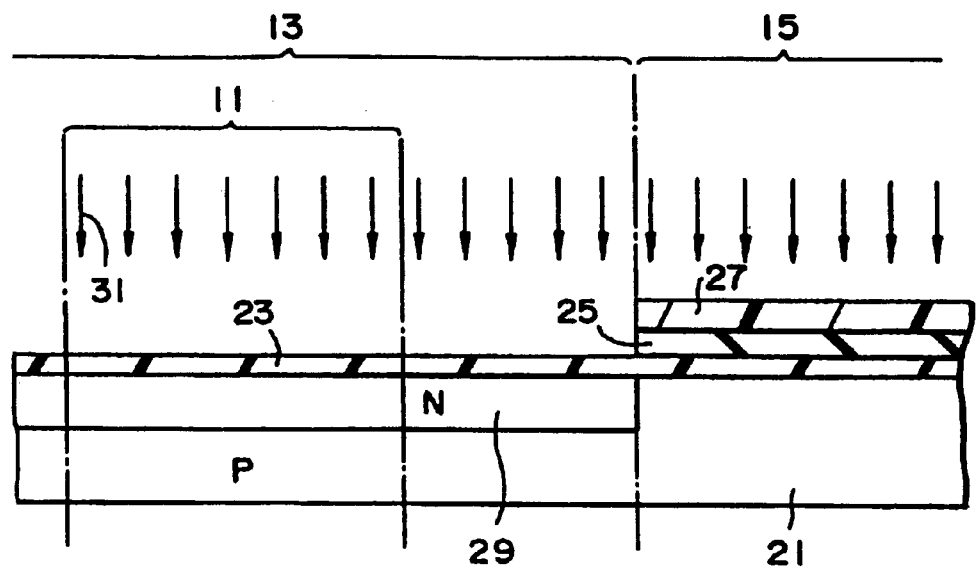
FIG. 1 is a sectional view showing a method of manufacturing a semiconductor device according to an embodiment of the present invention.

Certain embodiments of the present invention relate to a semiconductor device including a well structure having well areas that can be formed with a higher density of integration and a plurality of high-voltage endurable transistors that can be driven independently of one another with different voltages, and a method of manufacturing the semiconductor device.

A semiconductor device according to one preferred embodiment of the present invention comprises: a first well formed in a semiconductor substrate and having a first conductivity type; a second well formed in the semiconductor substrate adjacent to the first well and having a second conductivity type; a third well formed in the second well and having the first conductivity type; and a field effect transistor formed in each of the wells, the field effect transistor having an offset area in the semiconductor substrate around a gate insulating layer, the offset area being formed of a low-density impurity layer which is provided under a LOCOS (Local Oxidation of Silicon) layer on the semiconductor substrate.

With the semiconductor device of certain preferred embodiments, each field effect transistor (e.g., MOSFET) has a LOCOS offset structure, i.e., a structure wherein the offset area formed of a low-density impurity layer is provided under the LOCOS layer on the semiconductor substrate. A high-voltage endurable MOSFET with a high drain breakdown voltage can be therefore constructed. More specifically, by providing the offset area, which is formed of a low-density impurity layer, under a LOCOS layer for the offset structure (hereinafter referred to as an "offset LOCOS layer"), the offset area can be positioned at a deeper level relative to a channel area than the case of including no offset LOCOS layer. As a result, an electric field in the vicinity of a drain electrode can be mitigated and the drain withstand or breakdown voltage can be increased.

Also, with the semiconductor device of certain preferred embodiments, a triple well is constructed of the first well having the first conductivity type and the second well having the second conductivity type which are formed in the semiconductor substrate in adjacent relation, and the third well having the first conductivity type and formed in the second well. This arrangement of the triple well electrically separates the third well in the second well from the semiconductor substrate. As a result, a well having the same conductivity type as the semiconductor substrate and electrically separated from the semiconductor substrate can be obtained. Further, bias conditions may be set independently for each well.

Thus, by forming a high-voltage endurable transistor of the LOCOS offset structure in each well, output potentials of a high-voltage endurable CMOS (complementary MOS), for example, can be set to the positive and negative sides. Accordingly, even a high source voltage of, e.g., not lower than 10 V, more specifically in the range of 20–30 V, can be applied to the semiconductor device of preferred embodiments.

In addition, with the semiconductor device of certain preferred embodiments, since the first well and the second well can be provided in adjacent relation with self-alignment, a density of integration of wells can be increased.

Semiconductor devices of certain preferred embodiments can be implemented in various forms as follows.

The conductivity type of each of the wells is not particularly limited. The first conductivity type may be P-type and the second conductivity type may be N-type. Conversely, the first conductivity type may be N-type and the second conductivity type may be P-type.

In consideration of the withstand voltage of the field effect transistor, the punch-through withstand voltage between the semiconductor substrate and the third well, etc., the depth of the third well, may preferably be about ½ to about ⅓ of the depth of the second well.

In consideration of the withstand voltage of the field effect transistor, the punch-through withstand voltage between the semiconductor substrate and the third well, etc., the well depth is preferably in the range below. Specifically, it is preferred that the second well has a depth of about 15 μm to about 18 μm and the third well has a depth of about 6 μm to about 8 μm.

In consideration of the threshold and withstand voltage of the field effect transistor, the impurity density of each well is preferably in the range below. Specifically, it is preferred that the first well has an impurity density (surface density) of about $1 \times 10^{16}$ to about $3 \times 10^{16}$ atoms/cm$^3$, the second well has an impurity density (surface density) of about $1 \times 10^{16}$ to about $3 \times 10^{16}$ atoms/cm$^3$, and the third well has an impurity density (surface density) of about $1 \times 10^{16}$ to about $3 \times 10^{16}$ atoms/cm$^3$.

Here, the term "impurity surface density" means an amount of activated impurity occupying the surface of the semiconductor substrate per unit volume.

Preferably, around a high-density impurity layer constituting a source area or a drain area (hereinafter referred to as a "source/drain area") of the field effect transistor, a low-density impurity layer having the same conductivity type as the high-density impurity layer is provided. By providing such a low-density impurity layer, an area of the low-density impurity layer functions as a depletion layer and therefore the drain breakdown voltage can be increased when the field effect transistor is in an off-state.

Preferably, the low-density impurity layer mentioned in the above paragraph and a channel stopper layer provided under the LOCOS layer on the semiconductor substrate are continuously provided. With the continuity of the low-density impurity layer and the channel stopper layer formed under the LOCOS layer which serves as a device isolating area, for example, the conductivity type of the well, particularly, of the P-type well, is prevented from reversing under the LOCOS layer, and therefore a current leak can be suppressed.

In consideration of the withstand voltage of the field effect transistor, the gate insulating layer of the field effect transistor preferably has a film thickness of about 60 nm to about 80 nm.

A method of manufacturing a semiconductor device according to a preferred embodiment of the present invention comprises the steps (a) to (h) set forth below:

(a) selectively forming, on a semiconductor substrate, an oxidation-resistant layer having a masking action against oxidation;

(b) introducing an impurity of second conductivity type to the semiconductor substrate with the oxidation-resistant layer used as a mask, thereby forming a second well in the semiconductor substrate;

(c) selectively oxidating a surface area of the second well with the oxidation-resistant layer used as a mask, thereby forming a LOCOS layer in the second well;

(d) removing the oxidation-resistant layer;

(e) introducing an impurity of first conductivity type to the semiconductor substrate with the LOCOS layer used as a mask, thereby forming a first well in the semiconductor substrate in adjacent relation to the second well;

(f) removing the LOCOS layer;

(g) introducing an impurity of the first conductivity type to part of the second well, thereby forming a third well in the second well; and (h) forming a field effect transistor in each of the first, second and third wells, the step (h) comprising the steps of:

(h-1) after introducing an N-type and P-type impurity in predetermined areas of the semiconductor substrate, forming a LOCOS layer in a predetermined pattern on the semiconductor substrate to form N-type and P-type low-density impurity layers in the predetermined areas under the LOCOS layer, part of the LOCOS layer being formed at least around a gate insulating layer of the field effect transistor;

(h-2) forming a gate electrode; and (h-3) forming a high-density impurity layer constituting a source area or a drain area.

With the preferred manufacturing method set forth above, the well structure of the semiconductor device can be formed in a self-aligned manner.

Certain preferred embodiments of the present invention will be described below with reference to the drawings.

One example of a method of manufacturing a semiconductor device according to a preferred embodiment of the present invention will be first described. FIGS. 1–17 are sectional views schematically showing the preferred method of manufacturing the semiconductor device according to the preferred embodiment.

First, as shown in FIG. 1, a P-type silicon substrate 21 is thermally oxidized to form a silicon oxide layer 23 with a preferred thickness of about 40 nm on the surface of the P-type silicon substrate 21. Thereafter, a silicon nitride layer 25 is deposited as an oxidation-resistant layer with a preferred thickness of about 140 nm to about 160 nm on the silicon oxide layer 23, and a resist layer 27 is formed on the silicon nitride layer 25. The resist layer 27 is patterned to be positioned in an area 15 in which a P-type first well 35 is to be formed. Then, the silicon nitride layer 25 is etched away from an area 13, in which an N-type second well 29 is to be formed, with the resist layer 27 used as a mask. Thereafter, phosphorous ions 31 are injected to the P-type silicon substrate 21 in the area 13 under a preferred acceleration voltage of about 120 keV with the resist layer 27 and the silicon nitride layer 25 both used as masks.

Figure 2:
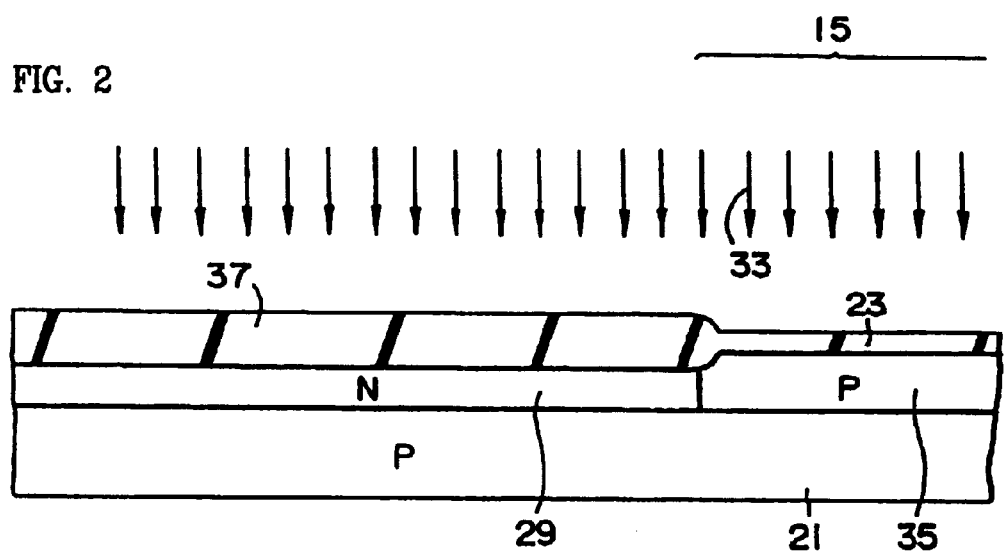
FIG. 2 is a sectional view showing a method of manufacturing a semiconductor device according to the embodiment of the present invention illustrated in FIG. 1, showing a step subsequent to the step of FIG. 1.

After etching away the resist layer 27, the P-type silicon substrate 21 is thermally oxidated with the silicon nitride layer 25 used as an oxidation-resistant mask, whereby a LOCOS (Local Oxidation Of Silicon) layer 37 with a preferred thickness of about 500 nm is formed on the N-type second well 29 (FIG. 2). Subsequently, the silicon nitride layer 25 is removed and boron ions 33 are injected to the P-type silicon substrate 21 in the area 15, in which the P-type first well 35 is to be formed, under a preferred acceleration voltage of 60 keV with the LOCOS layer 37 used as a mask. The ions injected to the areas 13 and 15 are then diffused (driven in), whereby the P-type first well 35 and the N-type second well 29 are formed in the P-type silicon substrate 21 in adjacent relation with self-alignment.

Figure 3:
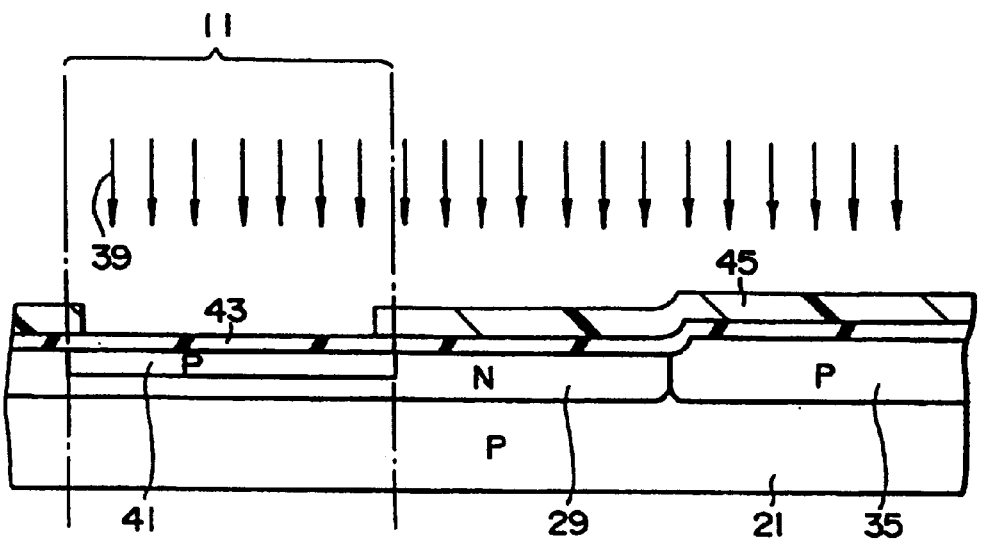
FIG. 3 is a sectional view showing a method of manufacturing a semiconductor device according to an embodiment of the present invention, showing a step subsequent to the step of FIG. 2.

After removing the silicon oxide layer 23 and the LOCOS layer 37, as shown in FIG. 3, a silicon oxide layer 43 is formed on the silicon substrate 21 by thermal oxidation. Then, a patterned resist layer 45 is formed on the silicon oxide layer 43, and boron ions 39 are injected to an area 11 in the N-type second well 29, in which a P-type third well 41 is to be formed, under a preferred acceleration voltage of about 60 keV with the resist layer 45 used as a mask. After removing the resist layer 45, the ions injected to the area 11, in which the P-type third well 41 is to be formed, are diffused (driven in) by annealing to form the P-type third well 41.

As described above, a triple well is formed in the P-type silicon substrate 21; i.e., the first well 35 formed in the P-type silicon substrate 21 and having a first conductivity (P-type in this embodiment), the second well 29 formed in the P-type silicon substrate 21 in adjacent relation to the first well 35 and having a second conductivity (N-type), and the third well 41 formed in the second well 29 and having the first conductivity (P-type).

Structures of the wells 35, 29 and 41 are set in consideration of the breakdown voltage and threshold of a MOSFET formed in each of the wells 35, 29 and 41, the junction withstand voltage and punch-through withstand voltage between the wells, etc. One example of the well structures in a semiconductor device, in which the withstand voltage of a MOSFET is not lower than 10 V, preferably in the range of about 20 V to about 30 V, will be described below.

The well depth is set in consideration of the withstand voltage of the MOSFET, the punch-through withstand voltage between the P-type silicon substrate 21 and the third well 41, etc. For example, the second well 29 preferably has a depth of about 15 $\mu$m to about 18 $\mu$m, and the third well 41 preferably has a depth of about 6 $\mu$m to about 8 $\mu$m. Note that the depth of the first well 35 cannot be readily defined because it has the same conductivity type as the silicon substrate 21.

Further, the impurity density of the well is set in consideration of the threshold and withstand voltage of the MOSFET. For example, the first well 35 preferably has an impurity density of about $1\times10^{16}$ to about $3\times10^{16}$ atoms/cm$^3$ in terms of surface density, the second well 29 preferably has an impurity density of about $1\times10^{16}$ to about $3\times10^{16}$ atoms/cm$^3$ in terms of surface density, and the third well 41 preferably has an impurity density of about $1\times10^{16}$ to about $3\times10^{16}$ atoms/cm$^3$ in terms of surface density.

The third well 41 is shallower than the second well 29, and the depth of the third well 41 is preferably set to about ½ to about ⅓ of that of the second well 29, taking into account the withstand voltage of the MOSFET, the punch-through withstand voltage between the P-type silicon substrate 21 and the third well 41, etc.

Figure 4:
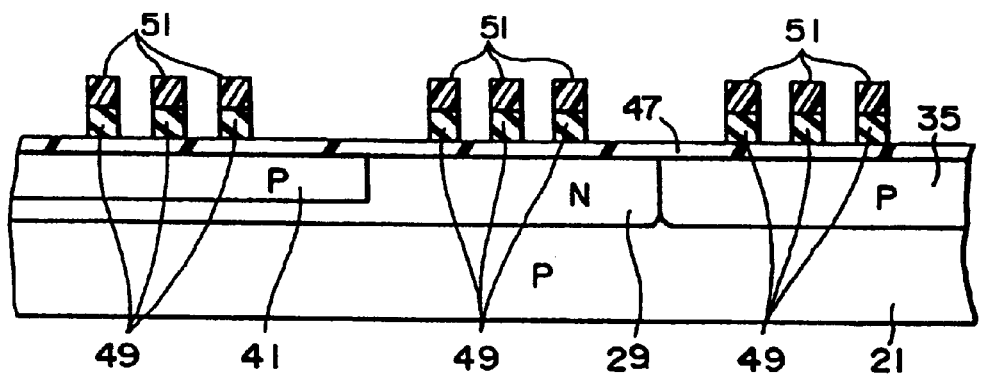
FIG. 4 is a sectional view showing a method of manufacturing a semiconductor device according to an embodiment of the present invention, showing a step subsequent to the step of FIG. 3.

Next, as shown in FIG. 4, the silicon oxide layer 43 is removed. The surface of the P-type silicon substrate 21 is then preferably thermally oxidated to form a silicon oxide layer 47 with a thickness of about 40 nm to about 80 nm on the surfaces of the first well 35, the second well 29 and the third well 41. Subsequently, a silicon nitride layer is formed on the silicon oxide layer 47, and a resist layer 51 is formed on the silicon nitride layer. By etching the silicon nitride layer with the resist layer 51 used as a mask, a patterned silicon nitride layer 49 is formed on the silicon oxide layer 47. The patterned silicon nitride layer 49 functions as a mask when low-density impurity layers 57 and 63 are introduced to the wells in later steps.

Figure 5:
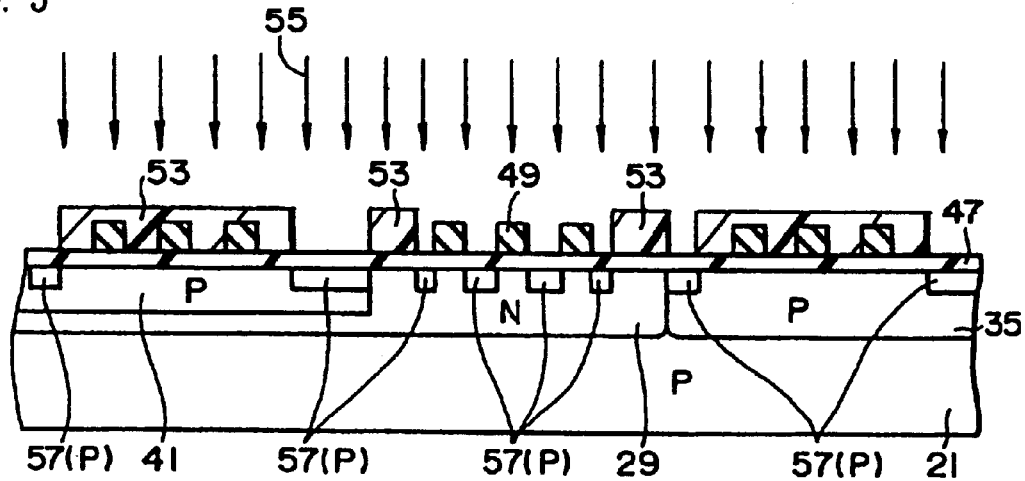
FIG. 5 is a sectional view showing a method of manufacturing a semiconductor device according to an embodiment of the present invention, showing a step subsequent to the step of FIG. 4.

After removing the resist layer 51, as shown in FIG. 5, a resist layer 53 is formed on the silicon nitride layer 49 and the silicon oxide layer 47. Boron ions 55 are injected to the P-type third well 41, the N-type second well 29 and the P-type first well 35 with the resist layer 53 and the silicon nitride layer 49 both used as masks, whereby a P-type low-density diffusion layer 57 is formed. The P-type impurity diffusion layer 57 serves as, for example, an offset impurity layer 57a in the second well 29 and channel stopper layers 57c in the first and third wells 35, 41 in later steps.

Figure 6:
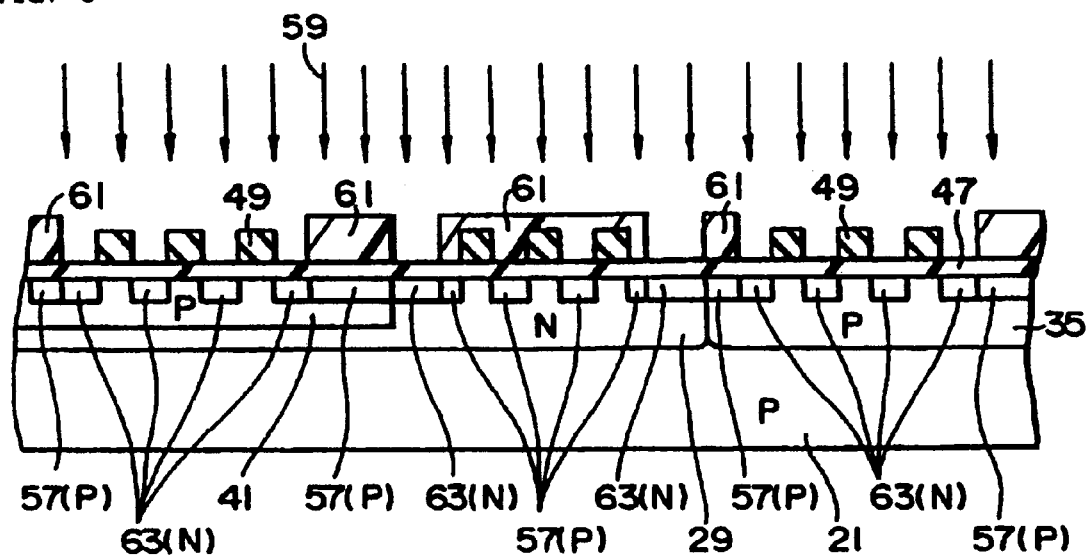
FIG. 6 is a sectional view showing a method of manufacturing a semiconductor device according to an embodiment of the present invention, showing a step subsequent to the step of FIG. 5.

Then, after removing the resist layer 53, as shown in FIG. 6, a resist layer 61 is formed on the silicon nitride layer 49 and the silicon oxide layer 47. Phosphorous ions 59 are injected to the third well 41, the second well 29 and the first well 35 with the resist layer 61 and the silicon nitride layer 49 both used as masks, whereby an N-type low-density diffusion layer 63 is formed. The N-type impurity diffusion layer 63 serves as, for example, offset impurity layers 63a in the first and third wells 35, 41 and a channel stopper layer 63c in the second well 29 in later steps.

Figure 7:
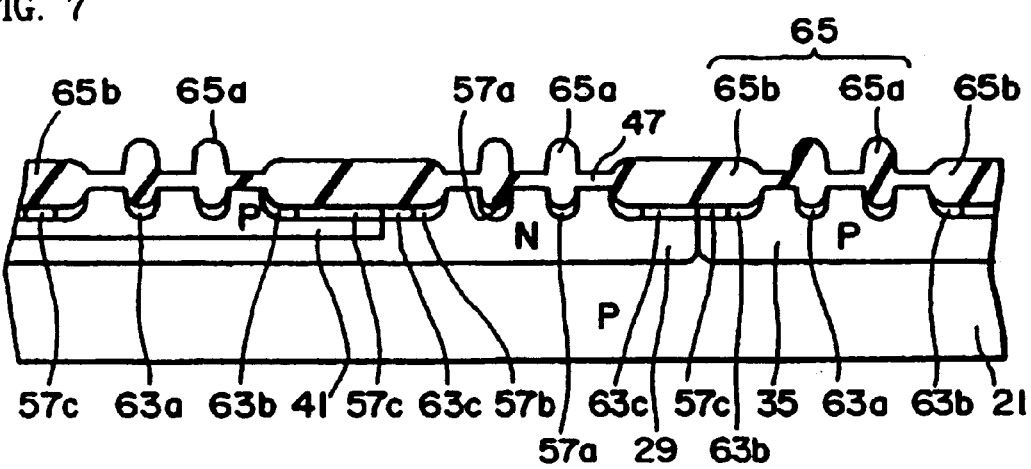
FIG. 7 is a sectional view showing a method of manufacturing a semiconductor device according to an embodiment of the present invention, showing a step subsequent to the step of FIG. 6.

After removing the resist layer 61, as shown in FIG. 7, the third well 41, the second well 29 and the first well 35 are thermally oxidated with the silicon nitride layer 49 used as an oxidation-resistant mask. With the thermal oxidation, a LOCOS layer 65 with a preferred thickness of about 900 nm is formed on the surfaces of the third well 41, the second well 29 and the first well 35, while the P-type low-density diffusion layer 57 (57a, 57b and 57c) and the N-type low-density diffusion layer 63 (63a, 63b and 63c) are formed under the LOCOS layer 65. The silicon nitride layer 49 is then removed.

The LOCOS layer 65 formed in the above step includes a portion serving as a device isolating area (hereinafter referred to as a "device isolating LOCOS layer 65b"), and a portion positioned around a gate insulating layer and serving as an offset area (hereinafter referred to as an "offset LOCOS layer 65a").

The P-type low-density diffusion layer 57 formed in the above step includes an offset impurity layer 57a serving as an offset area in the N-type second well 29, and a low-density impurity layer 57b provided outside a high-density impurity layer (see FIG. 7 or 17), which constitutes a source/drain area, for mitigating the intensity of an electric field. The P-type low-density impurity layer 57 also includes channel stopper layers 57c provided in the P-type first well 35 and third well 41 under the device isolating LOCOS layers 65b.

Likewise, the N-type low-density diffusion layer 63 includes offset impurity layers 63a serving as offset areas in the P-type first well 35 and third well 41, and a low-density impurity layer 63b provided outside the high-density impurity layer, which constitutes the source/drain area, for mitigating the intensity of an electric field. The N-type low-density impurity layer 63 also includes a channel stopper layer 63c provided in the N-type second well 29 under the device isolating LOCOS layer 65b.

In each of the wells 35, 29 and 41, as described later in detail, it is preferred that the low-density impurity layer for mitigating the intensity of an electric field and the channel stopper layer are provided in adjacent relation.

A gate insulating layer 78 with a film thickness of about 60 nm to about 80 nm is formed by removing the silicon oxide layer 47 and thermally oxidating the surface of the P-type silicon substrate 21.

Figure 8:
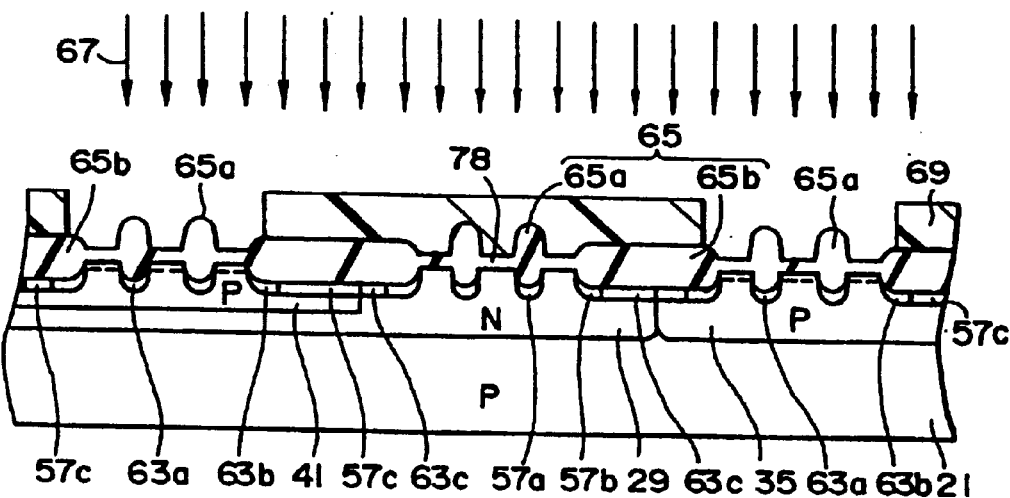
FIG. 8 is a sectional view showing a method of manufacturing a semiconductor device according to an embodiment of the present invention, showing a step subsequent to the step of FIG. 7.

Then, as shown in FIG. 8, a resist layer 69 is formed on a wafer including the LOCOS layer 65. Phosphorous ions 67 are injected to N-channel doped areas in the P-type third well 41 and first well 35 with the resist layer 69 used as a mask, thereby forming channel areas.

Figure 9:
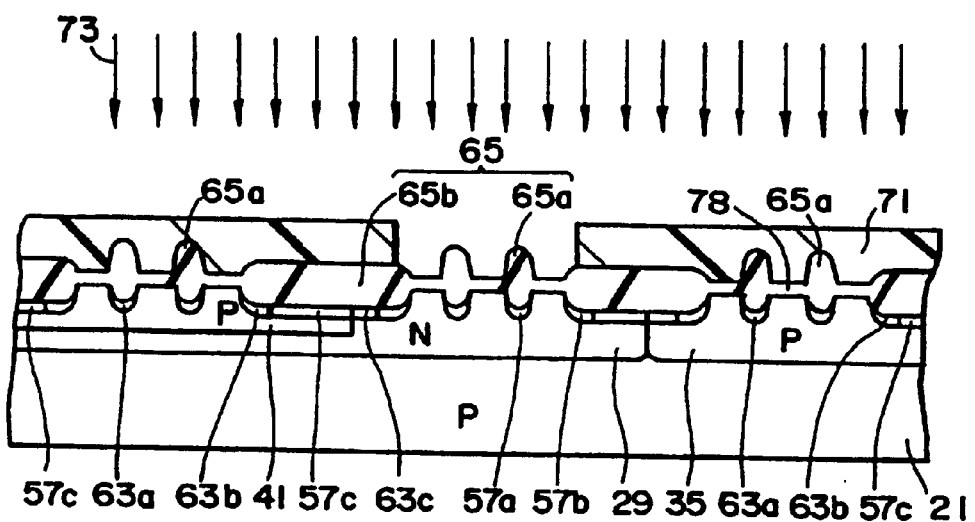
FIG. 9 is a sectional view showing a method of manufacturing a semiconductor device according to an embodiment of the present invention, showing a step subsequent to the step of FIG. 8.

After removing the resist layer 69, as shown in FIG. 9, a resist layer 71 is formed on the wafer including the LOCOS layer 65. Boron ions 73 are injected to a P-channel doped area in the N-type second well 29 with the resist layer 71 used as a mask, thereby forming a channel area.

Figure 10:
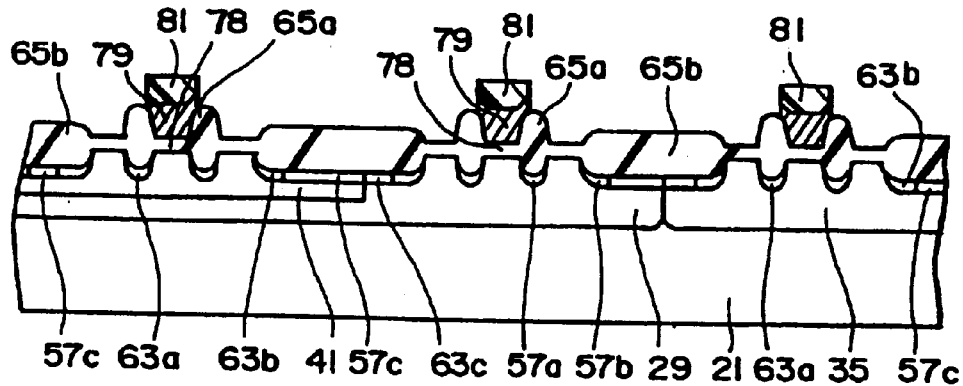
FIG. 10 is a sectional view showing a method of manufacturing a semiconductor device according to an embodiment of the present invention, showing a step subsequent to the step of FIG. 9.

Then, as shown in FIG. 10, a conductive polysilicon layer is deposited on the wafer including the LOCOS layer 65. Subsequently, a resist layer 81 is formed on the polysilicon layer, and the polysilicon layer is etched with the resist layer 81 used as a mask, whereby polysilicon gate electrodes 79 are formed on the silicon oxide layer 48 (gate insulating layer).

Figure 11:
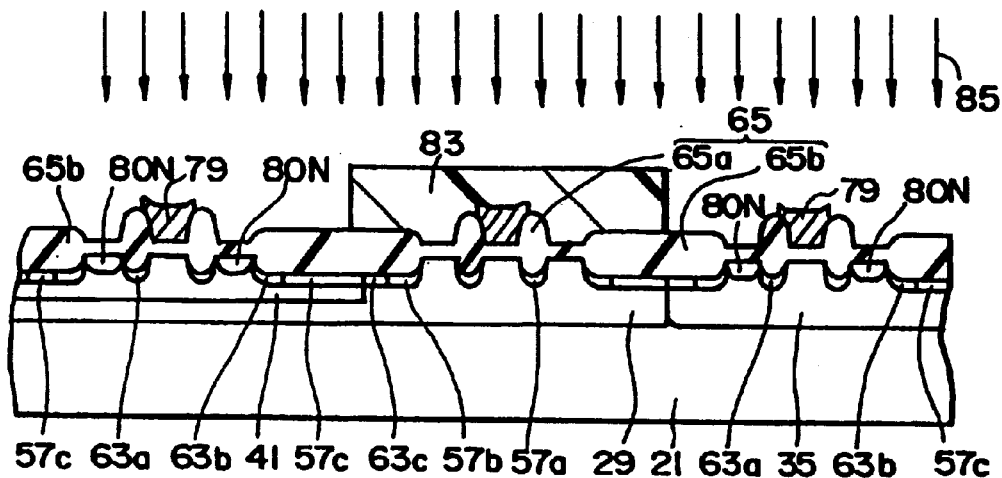
FIG. 11 is a sectional view showing a method of manufacturing a semiconductor device according to an embodiment of the present invention, showing a step subsequent to the step of FIG. 10.

After removing the resist layer 81, as shown in FIG. 11, a resist layer 83 is formed on the wafer including the gate electrodes 79. Phosphorous ions 85 are injected with the resist layer 83, the gate electrodes 79 and the LOCOS layer 65 all used as masks, thereby forming a high-density impurity layer 80N which constitutes a source/drain area of an N-channel transistor.

Figure 12:
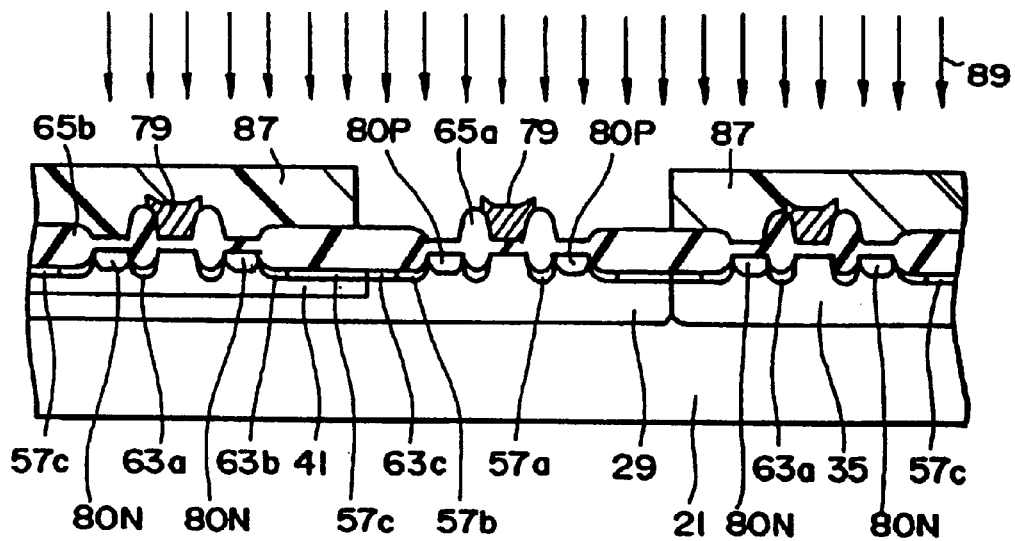
FIG. 12 is a sectional view showing a method of manufacturing a semiconductor device according to an embodiment of the present invention, showing a step subsequent to the step of FIG. 11.

Then, after removing the resist layer 83, as shown in FIG. 12, a resist layer 87 is formed on the wafer including the gate electrodes 79. Boron ions 89 are injected with the resist layer 87, the gate electrodes 79 and the LOCOS layer 65 all used as masks, thereby forming a high-density impurity layer 80P which constitutes a source/drain area of a P-channel transistor.

Figure 13:
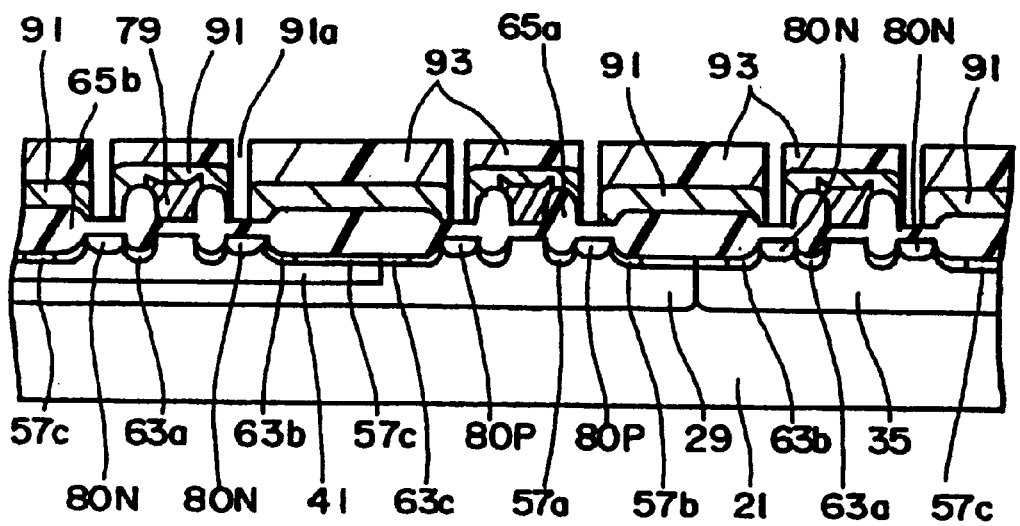
FIG. 13 is a sectional view showing a method of manufacturing a semiconductor device according to an embodiment of the present invention, showing a step subsequent to the step of FIG. 12.

After removing the resist layer 87, as shown in FIG. 13, a first interlayer insulating layer 91 is deposited on the wafer including the gate electrodes 79. A resist layer 93 is formed on the interlayer insulating layer 91, and the interlayer insulating layer 91 is etched with the resist layer 93 used as a mask, whereby contact holes 91 a are formed through the interlayer insulating layer 91.

Figure 14:
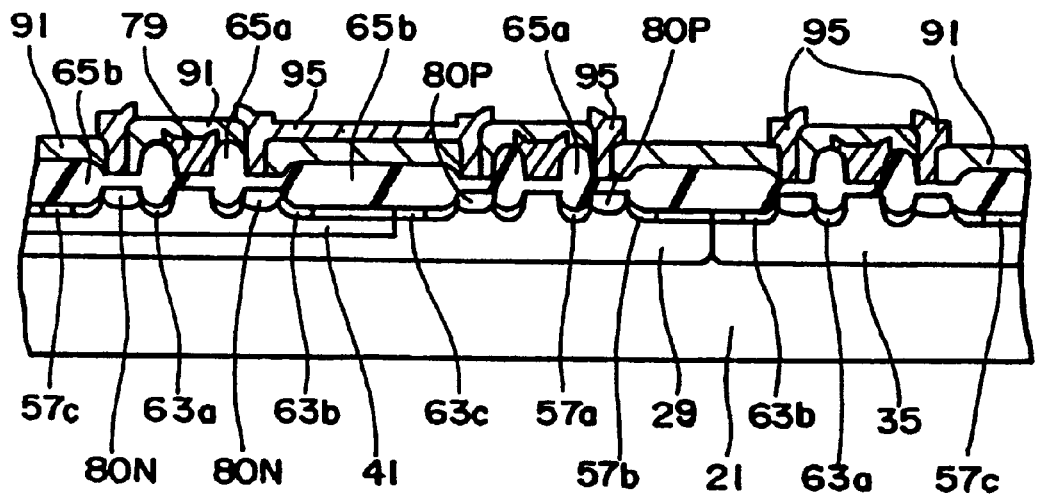
FIG. 14 is a sectional view showing a method of manufacturing a semiconductor device according to an embodiment of the present invention, showing a step subsequent to the step of FIG. 13.

Then, after removing the resist layer 93, as shown in FIG. 14, a conductive layer such as, for example, an aluminum alloy or copper is deposited in the contact holes 91a and on the first interlayer insulating layer 91. The conductive layer is patterned to form a first wiring layer 95.

Figure 15:
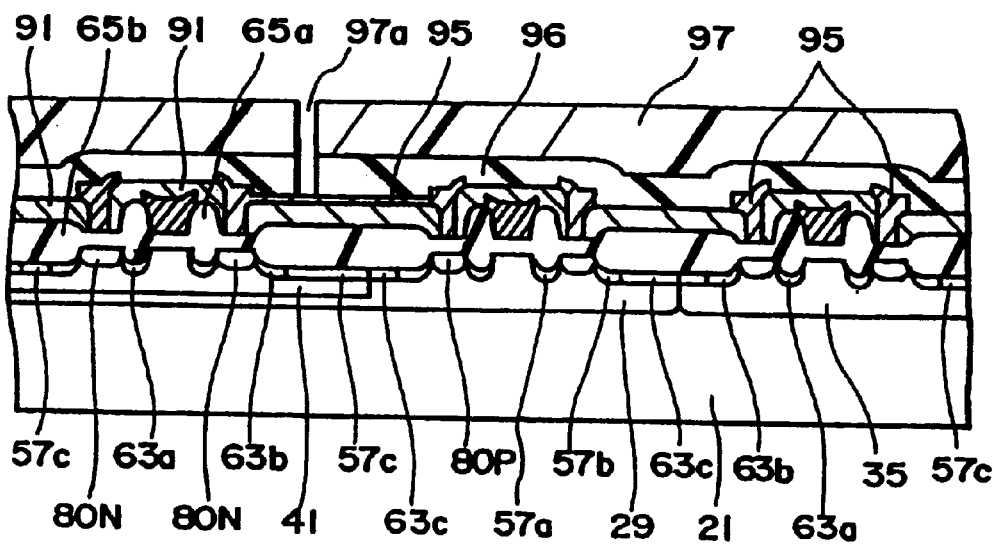
FIG. 15 is a sectional view showing a method of manufacturing a semiconductor device according to an embodiment of the present invention, showing a step subsequent to the step of FIG. 14.

Next, as shown in FIG. 15, a second interlayer insulating layer 96 is deposited on both the first wiring layer 95 and the first interlayer insulating layer 91, and a resist layer 97 is formed on the second interlayer insulating layer 96. By etching the second interlayer insulating layer 96 with the resist layer 97 use as a mask, contact holes 97a are formed through the interlayer insulating layer 96.

Figure 16:
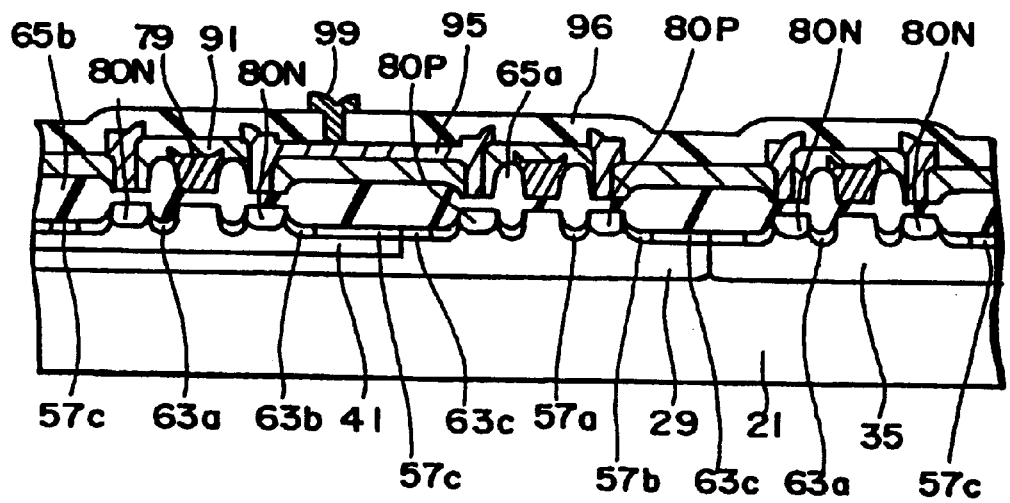
FIG. 16 is a sectional view showing a method of manufacturing a semiconductor device according to an embodiment of the present invention, showing a step subsequent to the step of FIG. 15.

After removing the resist layer 97, as shown in FIG. 16, a second wiring layer 99 is formed of a conductive layer such as an aluminum alloy or copper deposited in the contact holes 97a and on the second interlayer insulating layer 96.

Figure 17:
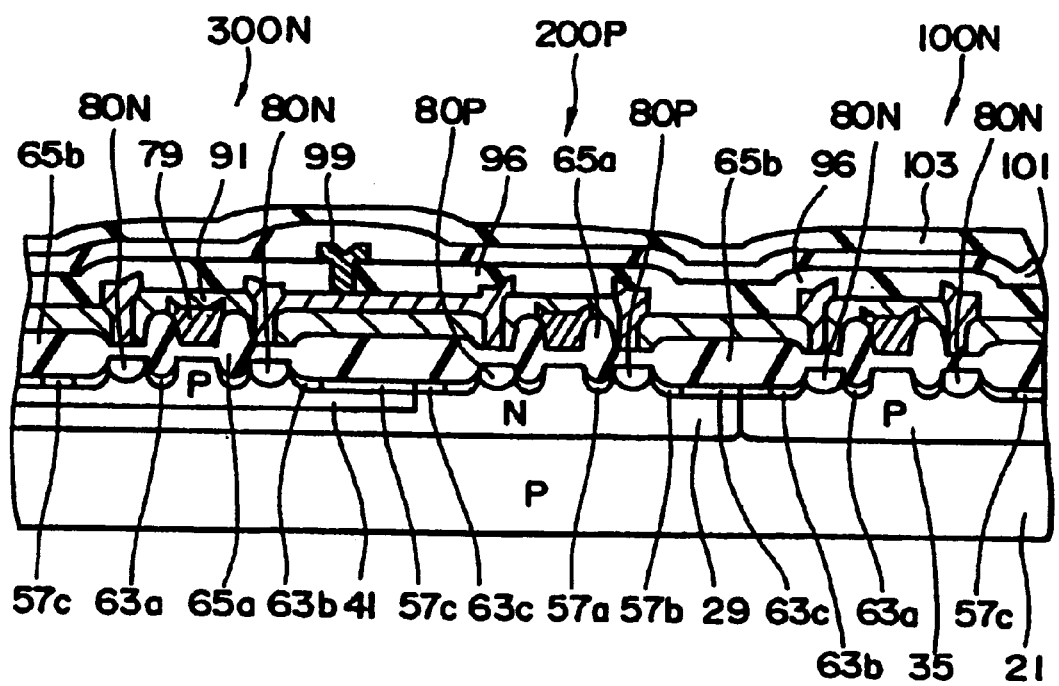
FIG. 17 is a sectional view showing a method of manufacturing a semiconductor device according to an embodiment of the present invention, showing a step subsequent to the step of FIG. 16.

Then, as shown in FIG. 17, a passivation layer is formed on the second wiring layer 99 and the second interlayer insulating layer 96. In this embodiment, the passivation layer can be formed by depositing a silicon oxide layer 101 and depositing a silicon nitride layer 103 on the silicon oxide layer 101.

Through the above-described steps, a semiconductor device according to a preferred embodiment may be formed.

Figure 18:
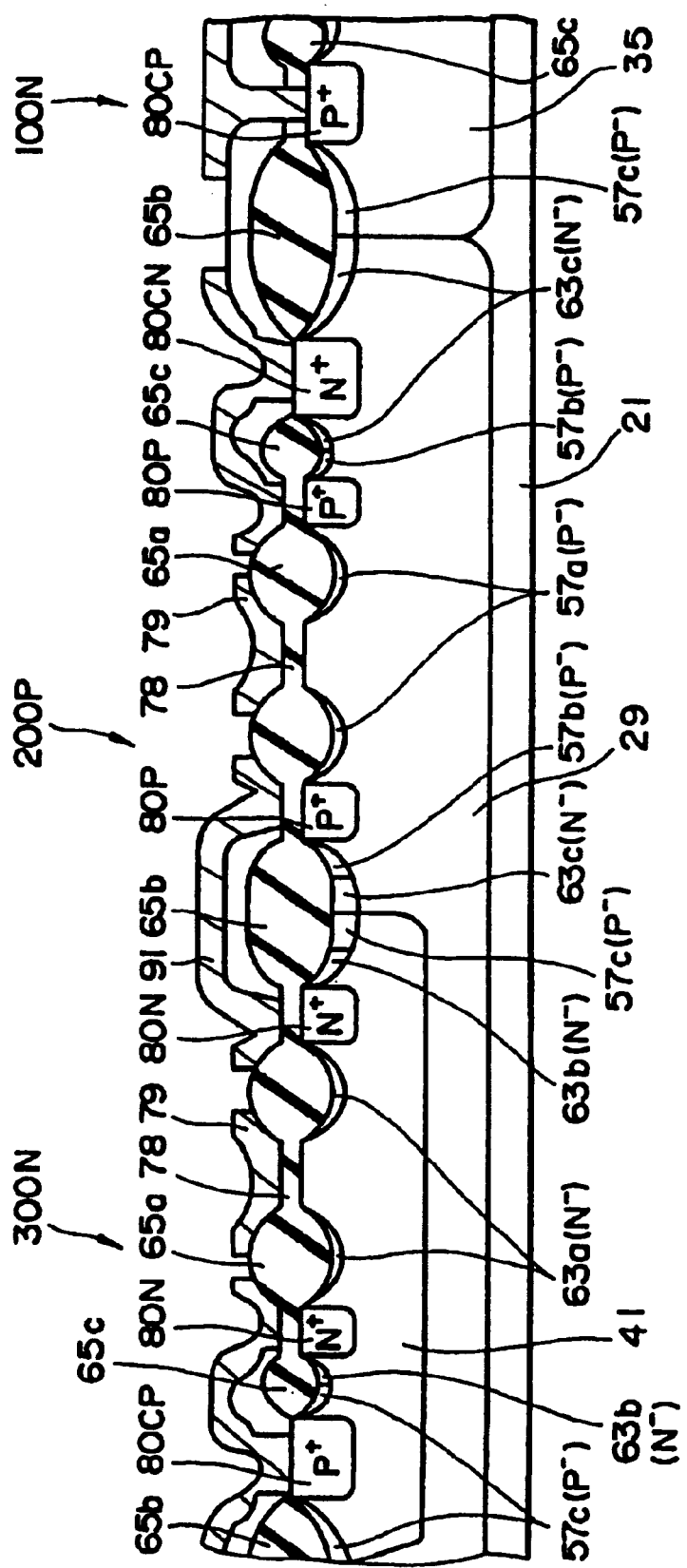
FIG. 18 is a sectional view showing a principal part of the semiconductor device according to the embodiment of the present invention in enlarged scale.
Figure 19:
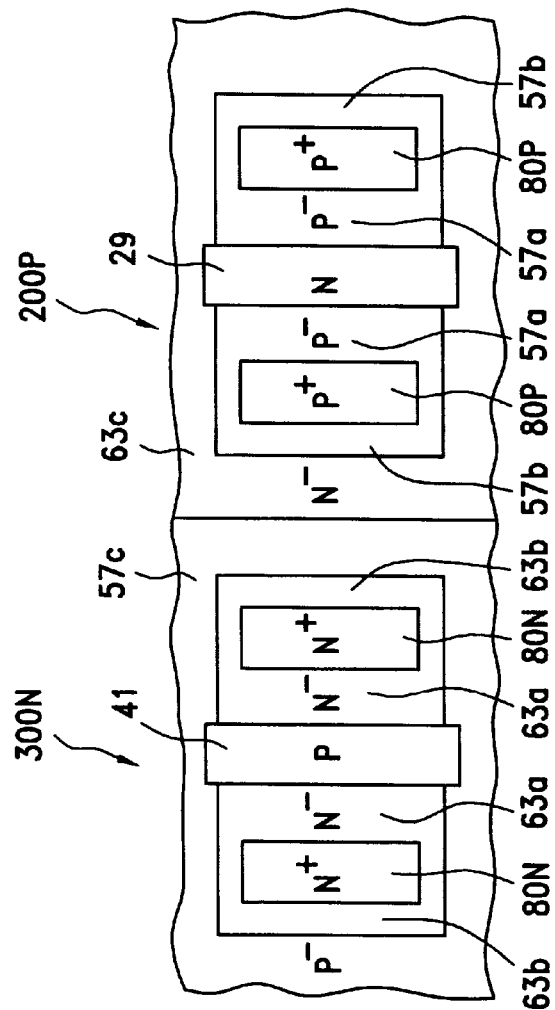
FIG. 19 is a plan view showing a principal part of a semiconductor device according to an embodiment of the present invention illustrated in FIG. 18, in enlarged scale.

FIG. 17 schematically shows a section of a semiconductor device formed in accordance with a preferred manufacturing method of this embodiment. FIG. 18 shows a principal part of the semiconductor device, in enlarged scale, including a second N-channel MOSFET 300N and a P-channel MOSFET 200P shown in FIG. 17. FIG. 18 also includes a portion not shown in FIG. 17. FIG. 19 is a plan view of a silicon substrate including the second N-channel MOSFET 300N and the P-channel MOSFET 200P shown in FIGS. 17 and 18. FIG. 19 shows a condition where the insulating layers formed on the silicon substrate are omitted, and indicates the conductivity types of the impurity layers formed on the silicon substrate.

In the semiconductor device illustrated in FIGS. 17 and 18, the P-type first well 35 and the N-type second well 29 are formed in adjacent relation, and the P-type third well 41 is formed in the N-type second well 29. A first N-channel MOSFET 100N is formed in the first well 35, the P-channel MOSFET 200P is formed in the second well 29, and the second N-channel MOSFET 300N is formed in the third well 41. Then, the MOSFETs 100N, 200P and 300N are isolated from each other by the device isolating LOCOS layers 65b.

Each MOSFET has a LOCOS offset structure. More specifically, each MOSFET includes an offset area between the gate electrode and the high-density impurity layer which constitutes the source/drain area. The offset area is constituted by the low-density impurity layer under the offset LOCOS layer which is formed in a predetermined area on the silicon substrate.

The structure of the N-channel MOSFET and the P-channel MOSFET will be described below.

A description is first made of the second N-channel MOSFET 300N. The N-channel MOSFET 300N has a LOCOS offset structure as shown in FIGS. 18 and 19. The N-channel MOSFET 300N comprises the gate insulating layer 78 provided in the P-type third well 41, the gate electrode 79 formed on the gate insulating layer 78, the offset LOCOS layer 65a provided around the gate insulating layer 78, the offset impurity layer 63a constituted by the N-type low-density impurity layer which is formed under the offset LOCOS layer 65a, and the N-type high-density impurity layers 80N provided outside the offset LOCOS layer 65a and constituting the source/drain areas.

A description is next made of the P-channel MOSFET 200P. The P-channel MOSFET 200P has a LOCOS offset structure as shown in FIGS. 18 and 19. The P-channel MOSFET 200P comprises the gate insulating layer 78 provided in the N-type second well 29, the gate electrode 79 formed on the gate insulating layer 78, the offset LOCOS layer 65a provided around the gate insulating layer 78, the offset impurity layer 57a constituted by the P-type low-density impurity layer which is formed under the offset LOCOS layer 65a, and the P-type high-density impurity layers 80P provided outside the offset LOCOS layer 65a and constituting the source/drain areas.

The first N-channel MOSFET 100N has the same basic structure as that of the second N-channel MOSFET 300N, and therefore its detailed description is omitted here.

The gate insulating layers 78 of the MOSFETs 100N, 200P and 300N each preferably have a film thickness of about 60 nm to about 80 nm, though depending on the breakdown voltages required for the MOSFETs, when a voltage of, e.g., not lower than 10 V, more specifically in the range of about 10 V to about 30 V, is applied.

The N-channel MOSFET 300N and the P-channel MOSFET 200P are electrically separated from each other by the device isolating LOCOS layer 65b. The device isolating LOCOS layer 65b is provided at the boundary between the P-type third well 41 and the N-type second well 29. Then, in the P-type third well 41, the channel stopper layer 57c constituted by the P-type low-density impurity layer is formed under the device isolating LOCOS layer 65b, and in the N-type second well 29, the channel stopper layer 63c constituted by the N-type low-density impurity layer is formed under the device isolating LOCOS layer 65b.

Further, in the third well 41, the N-type low-density impurity layer 63b is provided between the N-type high-density impurity layer 80N, which constitutes the source/drain area, and the P-type channel stopper layer 57c. Likewise, in the second well 29, the P-type low-density impurity layer 57b is provided between the P-type high-density impurity layer 80P, which constitutes the source/drain area, and the N-type channel stopper layer 63c.

Moreover, in the third well 41, the N-type low-density impurity layer 63b and the P-type channel stopper layer 57c are contiguously formed. Likewise, in the second well 29, the P-type low-density impurity layer 57b and the N-type channel stopper layer 63c are continuously formed.

By providing the low-density impurity layers 63b, 57b under the device isolating LOCOS layers 65b for isolating the MOSFETs in adjacent relation to the high-density impurity layers 80N, 80P which constitute the source/drain areas, respectively, the areas of the low-density impurity layers 63b, 57b function as depletion layers and therefore the drain withstand voltage can be increased when the MOSFETs are in an off-state.

Also, since the low-density impurity layer 63b and the channel stopper layer 57c are continuously formed under the device isolating LOCOS layer 65b in the P-type third well 41, the conductivity type of the third well 41 is prevented from reversing under the device isolating LOCOS layer 65b, and therefore a current leak can be suppressed. More specifically, if the low-density impurity layer 63b and the channel stopper layer 57c are separated from each other, the P-type impurity (such as boron) contained in the P-type third well 41 is absorbed by the device isolating LOCOS layer 65b, formed of the silicon oxide layer, in an area where the low-density impurity layer and the channel stopper layer are not present. Then, the N-type impurity (such as phosphorous) is conversely released into the third well 41 from the device isolating LOCOS layer 65b. As a result, in an area where the low-density impurity layer and the channel stopper layer are not present, a phenomenon of reversal of the conductivity type tends to occur due to a relative shortage of the P-type impurity.

Such a phenomenon may be more notable in the P-type third well 41 which is formed by counter-doping the P-type impurity such as boron in the N-type second well 29 where the density of the N-type impurity such as phosphorous is high, while it does not appear in the N-type second well 29 and the P-type first well 35 which includes no counter-doped area. Further, such a phenomenon hardly poses a problem in MOSFETs with a low breakdown voltage which constitute a logic circuit or the like, but it is more apt to cause a problem in MOSFETs with a high breakdown voltage which are handled by this embodiment.

According to this embodiment, also in the second well 29, the P-type low-density impurity layer 57b is provided between the high-density impurity layer 80P, which constitutes the source/drain area, and the channel stopper layer 63c.

In the semiconductor device shown in FIG. 18, contact layers 80CP each formed of a P-type high-density impurity layer are provided in the first and third wells 35, 41, and a contact layer 80CN formed of an N-type high-density impurity layer is provided in the second well 29. Note that the contact layers 80CP, 80CN are not shown in FIG. 17. The contact layers 80CP, 80CN are isolated by the LOCOS layers 65c respectively from the high-density impurity layers 80N, 80P which constitutes the source/drain areas.

Under the LOCOS layer 65c in the third well 41, the N-type low-density impurity layer 63b is provided adjacently to the N-type high-density impurity layer 80N, and the P-type low-density impurity layer 57c is provided adjacently to the contact layer 80CP. Then, the N-type low-density impurity layer 63b and the P-type low-density impurity layer 57c are contiguous to each other. The contiguous formation of the low-density impurity layer 63b and the low-density impurity layer 57c provides a similar advantage as that resulting from the above-mentioned arrangement that the low-density impurity layer 57b and the channel stopper layer 63c are contiguously formed under the device isolating LOCOS layer 65b.

Likewise, under the LOCOS layer 65c in the second well 29, the P-type low-density impurity layer 57b is provided adjacent to the P-type high-density impurity layer 80P, and the N-type low-density impurity layer 63c is provided adjacent to the contact layer 80CN.

With this embodiment, since each MOSFET has the LOCOS offset structure, a high-voltage endurable MOSFET with a high drain withstand voltage can be constructed. More specifically, by providing the offset impurity layers 63a, 57a, each being formed of the low-density impurity layer, under the offset LOCOS layer 65a, the offset impurity layers 63a, 57a can be positioned at a deeper level relative to the channel areas than the case of including no offset LOCOS layers. As a result, when the MOSFETs are in an off-state, deeper depletion layers can be formed by the offset impurity layers 63a, 57a. It is thus possible to mitigate an electric field in the vicinity of each drain electrode and to increase the drain breakdown voltage.

With the semiconductor device of this embodiment, a triple well is formed such that twin wells comprising the N-type second well 29 and the P-type first well 35 are formed in the P-type silicon substrate 21 in adjacent relation, and the P-type third well 41 is formed in the N-type second well 29. This arrangement electrically separates the third well 41 in the second well 29 from the P-type silicon substrate 21. Therefore, bias conditions can be set independently for each well.

Figure 20:
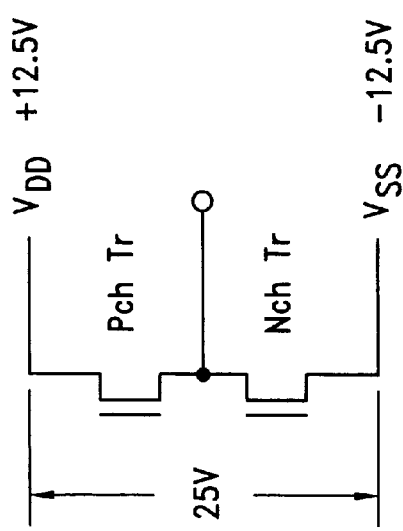
FIG. 20 is an equivalent circuit diagram of a high-voltage endurable CMOS to which a semiconductor device according to an embodiment of the present invention is applied.

Then, an applied voltage can be set for each of the third well 41 and the second well 29 independently of the voltage applied to the silicon substrate. By forming a high-voltage endurable transistor of the LOCOS offset structure in each well, output potentials of a high-voltage endurable CMOS (complementary MOS) can be set to the positive and negative sides relative to the substrate potential, by way of example, as shown in FIG. 20. Accordingly, even a high source voltage of, e.g., not lower than 10 V, particularly in the range of 20–30 V, can be applied to the MOS transistor of this embodiment.

Also, with this embodiment, since the P-type first well 35 and the N-type second well 29 can be provided in adjacent relation with self-alignment, a density of integration of wells can be increased.

Since impurity ions are injected in separate steps for forming the first well 35 and the third well 41, impurity densities at the respective well surfaces can be set independently.

Further, the high-voltage endurable transistor of this embodiment can be formed on the same chip as a semiconductor device which constitutes a logic circuit.

The present invention is not limited to the above-described embodiments, and can be implemented in various embodiments without departing the scope of the invention. For example, while the first conductivity type is P-type and the second conductivity type is N-type in the above-described embodiment, the conductivity types may be reversed. Also, the layer structure or planar structure of the semiconductor device may differ from that in the above-described embodiments depending on device design.

What is claimed:

1. A method of manufacturing a semiconductor device, comprising:

selectively forming, on a semiconductor substrate, an oxidation-resistant layer having a masking action against oxidation;

introducing an impurity of second conductivity type to said semiconductor substrate with said oxidation-resistant layer used as a mask, thereby forming a second well in said semiconductor substrate;

selectively oxidizing a surface area of said second well with said oxidation-resistant layer used as a mask, thereby forming a LOCOS layer in said second well;

removing said oxidation-resistant layer;

introducing an impurity of first conductivity type to said semiconductor substrate with said LOCOS layer used as a mask, thereby forming a first well in said semiconductor substrate in adjacent relation to said second well;

removing said LOCOS layer;

introducing an impurity of the first conductivity type to part of said second well, thereby forming a third well in said second well; and forming a field effect transistor in each of said first, second and third wells, by a process comprising:

after introducing a first conductivity type impurity and a second conductivity type impurity in areas of said semiconductor substrate, forming a LOCOS layer in a pattern on said semiconductor substrate to form first conductivity type and second conductivity type low-density impurity layers in said areas under the LOCOS layer, part of said LOCOS layer being formed at least around a gate insulating layer of said field effect transistor;

forming a gate electrode; and forming a high-density impurity layer comprising a source/drain area.

2. A method of manufacturing a semiconductor device according to claim 1, wherein the first conductivity type is P-type and the second conductivity type is N-type.

3. A method of manufacturing a semiconductor device according to claim 1, wherein the first conductivity type is N-type and the second conductivity type is P-type.

4. A method of manufacturing a semiconductor device according to claim 1, wherein the depth of said third well is about ½ to about ⅓ of the depth of said second well.

5. A method of manufacturing a semiconductor device according to claim 1, wherein said second well has a depth of 15–18 μm and said third well has a depth of 6–8 μm.

6. A method of manufacturing a semiconductor device according to claim 1, wherein said first well has an impurity density of $1\times10^{16}$–$3\times10^{16}$ atoms/cm$^3$, said second well has an impurity density of $1\times10^{16}$–$3\times10^{16}$ atoms/cm$^3$, and said third well has an impurity density of $1\times10^{16}$–$3\times10^{16}$ atoms/cm$^3$.

7. A method of manufacturing a semiconductor device according to claim 1, wherein, around the high-density impurity layer comprising the source area or the drain area of said field effect transistor, a low-density impurity layer having the same conductivity type as said high-density impurity layer is provided.

8. A method of manufacturing a semiconductor device according to claim 1, wherein said low-density impurity layer and a channel stopper layer provided under the LOCOS layer on said semiconductor substrate are contiguously provided.

9. A method of manufacturing a semiconductor device according to claim 7, wherein said low-density impurity layer and a channel stopper layer provided under the LOCOS layer on said semiconductor substrate are contiguously provided.

10. A method of manufacturing a semiconductor device according to claim 1, wherein the gate insulating layer of said field effect transistor has a film thickness of from about 60 nm to about 80 nm.

11. A method of manufacturing a semiconductor device according to claim 1, wherein said gate insulating layer of said field effect transistor has a film thickness of from 60 nm to 80 nm.

12. A method of manufacturing a semiconductor device, comprising:

forming a first well of a first conductivity type in a semiconductor substrate;

forming a second well of a second conductivity type in said semiconductor substrate;

forming a third well within said second well, said third well having said first conductivity type, said third well formed to be about ⅓ to about ½ the depth of said second well; and forming a field effect transistor in each of said first, second and third wells, each of said transistors formed by introducing a low density impurity selected from the group consisting of an N-type impurity and a P-type impurity into areas of said semiconductor substrate, forming a LOCOS layer in a pattern on said semiconductor substrate, forming a gate electrode, and forming a high density impurity layer comprising a source/drain area, wherein at least a portion of said LOCOS layer is positioned adjacent to and in contact with a gate insulating layer and said gate electrode.

13. A method of claim 12, wherein said third well formed to be from ⅓ to ½ of the depth of said second well.

14. A method of manufacturing a semiconductor device, comprising:

forming a first well of a first conductivity type in a semiconductor substrate;

forming a second well of a second conductivity type in said semiconductor substrate;

forming a third well within said second well, said third well having said first conductivity type; and forming a field effect transistor in each of said first, second and third wells, each of said transistors formed by introducing a low density impurity selected from the group consisting of an N-type impurity and a P-type impurity into areas of said semiconductor substrate, forming a LOCOS layer in a pattern on said semiconductor substrate, forming a gate electrode, and forming a high density impurity layer to act as a source/drain area.

15. A method as in claim 14, wherein said third well is formed to be from ⅓ to ½ of the depth of said second well.

16. A method as in claim 14, wherein at least a portion of said LOCOS layer is positioned adjacent to and in contact with a gate insulating layer and said gate electrode.

17. A method of manufacturing a semiconductor device according to claim 14, wherein said second well has a depth of from 15 μm to 18 μm and said third well has a depth of from 6 μm to 8 μm.

18. A method of manufacturing a semiconductor device according to claim 14, wherein said first well has an impurity density of from $1\times10^{16}$ atoms/cm$^3$ to $3\times10^{16}$ atoms/cm$^3$, said second well has an impurity density of from $1\times10^{16}$ atoms/cm$^3$ to $3\times10^{16}$ atoms/cm$^3$, and said third well has an impurity density of from $1\times10^{16}$ atoms/cm$^3$ to $3\times10^{16}$ atoms/cm$^3$.

19. A method of manufacturing a semiconductor device according to claim 14, wherein, around said high-density impurity layer of said field effect transistor, a low-density impurity layer having the same conductivity type as said high-density impurity layer is provided.

* * * * *